United States Patent [19]
Arcesi et al.
[11] 3,929,489
[45] Dec. 30, 1975

[54] LITHOGRAPHIC PLATES HAVING RADIATION SENSITIVE ELEMENTS DEVELOPABLE WITH AQUEOUS ALCOHOL

[75] Inventors: Joseph A. Arcesi; Frederick J. Rauner, both of Rochester, N.Y.

[73] Assignee: Eastman Kodak Company, Rochester, N.Y.

[22] Filed: Sept. 14, 1973

[21] Appl. No.: 397,179

[52] U.S. Cl. ..................... 96/115 R; 96/33; 96/35.1; 204/159.15; 204/159.19; 260/75 N

[51] Int. Cl.$^2$ .. G03C 1/68; F01B 3/00; C08G 63/60

[58] Field of Search ................... 96/115 R, 33, 35.1; 260/75 N; 204/159.15, 159.19

[56] References Cited

UNITED STATES PATENTS

| | | | |
|---|---|---|---|
| 3,546,180 | 12/1970 | Caldwell et al. | 260/75 N |
| 3,615,628 | 10/1971 | Mench et al. | 96/115 R |
| 3,622,320 | 11/1971 | Allen | 96/115 R |
| 3,628,963 | 12/1971 | Akamatsu et al. | 96/115 R |
| 3,635,720 | 1/1972 | Steppan et al. | 96/115 R |
| 3,726,685 | 4/1973 | Philipot et al. | 96/115 R |
| 3,732,097 | 5/1973 | Dickie et al. | 96/115 R |
| 3,825,430 | 7/1973 | Kurka | 96/115 R |

*Primary Examiner*—Jack P. Brammer
*Attorney, Agent, or Firm*—R. F. Cody

[57] ABSTRACT

A condensation copolymer is disclosed which is capable of being crosslinked by exposure to radiation and which, prior to exposure, is capable of being transported in an aqueous alcoholic alkaline developer. The condensation copolymer has first dicarboxylic acid derived repeating units containing non-aromatic ethylenic unsaturation capable of providing crosslinking sites and second aromatic dicarboxylic acid derived repeating units containing disulfonamido units containing monovalent cations as amido nitrogen atom substituents. The photographic elements formed from the condensation copolymer are particularly useful as lithographic plates.

6 Claims, No Drawings

LITHOGRAPHIC PLATES HAVING RADIATION SENSITIVE ELEMENTS DEVELOPABLE WITH AQUEOUS ALCOHOL

The present invention is directed to a novel radiation-sensitive element capable of being developed with an aqueous alcoholic alkaline developer. In another aspect this invention is directed to a radiation-sensitive composition containing a crosslinkable condensation copolymer having solubilizing repeating units. This invention is also directed to certain novel crosslinkable copolymers containing substituents capable of rendering them soluble in polar solvents in their uncrosslinked form.

Radiation-sensitive compositions are generally categorized in the photographic arts as being either positive-working or negative-working. Positive-working compositions are used to form radiation-sensitive coatings which can be selectively solubilized in radiation-struck areas, thus leaving behind a positive of the exposure image. In a common form, positive-working compositions can be coated and developed using aqueous solvents. For example, development is usually achieved by swabbing the radiation-sensitive coating after exposure with an aqueous alkaline developer solution.

Negative-working compositions can be formed from polymers which crosslink in radiation-struck areas. A coating is ordinarily formed using an organic solvent as a coating aid. A developer is used in removing the unexposed portions of the coating to form a negative image. The organic developers used with negative-working radiation sensitive coatings are expensive as compared with the aqueous alkaline solutions employed with positive-working coatings. Further, these organic developers are substantially more burdensome to dispose of after use than aqueous alkaline solutions, since, if untreated, they can be ecologically objectionable.

It is an object of this invention to provide a radiation-sensitive element that can be developed using aqueous alkaline solutions.

It is another object to provide a radiation-sensitive composition capable of forming negative-working coatings which can be crosslinked on image-wise exposure and which remain selectively soluble in unexposed areas.

It is a further object of this invention to provide a novel class of crosslinkable copolymers incorporating repeating units capable of imparting altered solubilizing characteristics to the uncrosslinked copolymers.

It is a specific object to provide a linear, film-forming crosslinkable copolyester containing repeating units containing repeating polar solubilizing substituents and capable of imparting solubility in polar solvents.

It is a still further object to provide improved photoresist compositions and elements formed therefrom, such as relief and lithographic printing plates.

In one aspect this invention is directed to a radiation-sensitive composition comprising a soluble condensation polymer having first and second dicarboxylic acid derived repeating units. The first dicarboxylic acid derived repeating units contain non-aromatic ethylenic unsaturation capable of providing crosslinking sites for the purpose of insolubilizing the polymer upon exposure of the composition of actinic radiation. As the improvement of this invention, the polymer also incorporates second, aromatic dicarboxylic acid derived repeating units containing disulfonamido units containing monovalent cations as amido nitrogen atom substituents, thus rendering the polymer in its unexposed form soluble in an aqueous alcoholic alkaline developer.

In another aspect the invention is directed to a radiation-sensitive element, such as a lithographic or relief plate, comprised of a support and a coating thereon comprised of the above radiation-sensitive composition of this invention.

In still another aspect the invention is directed to a novel crosslinkable polymer having an inherent viscosity of at least 0.20 consisting essentially of ester repeating units and having from 98 to 55 mole percent (based on the total acid units of the polyester) of first dicarboxylic acid derived repeating units containing non-aromatic vinyl unsaturation capable of providing crosslinking sites. The polyester is additionally comprised of from 2 to 45 percent (based on the total acid units of the polyester) of second dicarboxylic acid derived repeating units of the formula

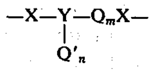

wherein

X is a carbonyl group;

$n$ and $m$ are integers whose sum equals 1;

Q is defined by the formula

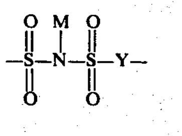

Q′ is defined by the formula

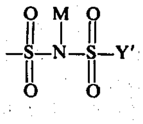

Y is an aromatic group;

Y′ is an aromatic group or an alkyl group having from 1 through 12 carbon atoms; and M is a solubilizing cation.

An essential element in the practice of this invention is a film-forming condensation copolymer which is soluble in aqueous developers and which can be selectively crosslinked to an insoluble form. The condensation copolymers are comprised of first repeating units (I) provided for the purpose of introducing crosslinking sites and second repeating units (II) containing solubilizing substituents.

Generally the copolymers of this invention are copolyesters formed by condensing one or more polyhydric alcohols with at least two carboxylic acids each containing at least two condensation sites. At least one of the carboxylic acids contains at least one site of non-aromatic ethylenic unsaturation while a remaining carboxylic acid contains a solubilizing sulfonate substituent. As employed herein the term "non-aromatic ethylenic unsaturation" is inclusive of carbon to carbon double bonding in both aliphatic and alicyclic moieties. It is, of course, recognized that amido groups can be used as linking groups rather than ester groups. This modification is readily achieved by condensing in the presence of amino alcohols, diamines or amino acids. The carboxylic acids can be condensed in the form of a free acid or in the form of a functional derivative, such as an anhydride, a lower alkyl ester or an acid halide.

In one preferred form the repeating units (I) are light-sensitive units of the type disclosed by Schellenberg and Bayer in U.S. Pat. No. 3,030,208 issued Apr. 17, 1962. These repeating units contain at least two condensation sites at least one which is derived from a group of the formula (A) 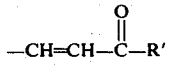

bonded directly to an aromatic nucleus. R′ can be, for instance, an hydroxyl group where the compound is a free acid, an oxy atom linkage where the compound is an acid anhydride, a halogen atom where the compound is in the form of an acid halide or an alkoxy radical where the compound is in the form of an ester.

The repeating units (I) containing the groups (A) are preferably formed from cinnamic acid and its derivatives. Such compounds can be generically defined by the formula (B) 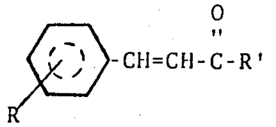

wherein R′ is as previously defined and R represents one or more alkyl, aryl, aralkyl, alkoxy, nitro, amino, acrylic or carboxyl groups or hydrogen or halogen atoms and is chosen to provide at least one condensation site. To increase the concentration of light-sensitive groups (A), in a specific preferred form R is chosen to provide at least one additional group of the formula (A). A preferred compound for forming the repeating units (I) is p-phenylene diacrylic acid or a derivative thereof. Other useful compounds are disclosed by Schellenberg and Bayer, cited above. Still other compounds which can be used to form the repeating units (I) are disclosed in Laakso U.S Pat. No. 3,702,765, issued Nov. 14, 1972, and Allen U.S. Pat. No. 3,622,320. The disclosures of each of these patents are here incorporated by reference.

In another preferred form the repeating units (I) can be formed from dicarboxylic acids having the formula (C) 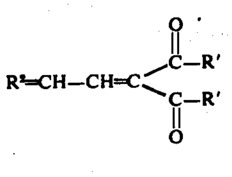

wherein $R^2$ represents an alkylidene, aralkylidene or heterocyclic group, or a derivative thereof and R′ is as previously defined. Examples of diacids that correspond to the general formula (C) and that are particularly useful in the practice of the present invention include cinnamylidenemalonic acid, 2-butenylidenemalonic acid, 3-pentenylidenemalonic acid, o-nitrocinnamylidenemalonic acid, naphthylallylidenemalonic acid, 2-furfurylideneethylidenemalonic acid, N-methylpyridylidene-2-ethylidenemalonic acid, N-methylquinolidene-2-ethylidenemalonic acid, N-methylbenzothiazolylidene-2-ethylidenemalonic acid, and the like, as well as functional derivatives of these acids. Such acids are fully disclosed by Philipot et al., U.S. Pat. No. 3,674,745, issued July 4, 1972, the disclosure of which is here incorporated by reference.

In still another preferred form the repeating units (I) can be formed from muconic acid or a functional derivative thereof having the formula (D) 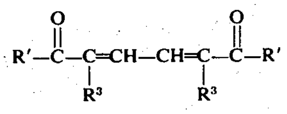

where R′ is as previously defined and $R^3$ is a hydrogen atom or a methyl group. Exemplary muconic acids are trans, trans-muconic acid; cis, transmuconic acid; cis, cis-muconic acid; $\alpha,\alpha'$-cis, trans-dimethylmuconic acid, and $\alpha,\alpha'$-cis, cis-dimethylmuconic acid. These and other muconic acid compounds useful in forming repeating units (I) in the practice of this invention are more fully disclosed in McConkey U.S. Pat. No. 3,615,434 issued Oct. 26, 1971, the disclosure of which is here incorporated by reference.

In an additional preferred form the repeating units (I) can be formed from unsaturated carbocyclic dicarboxylic acids or their derivatives. Such compounds can be represented by the structural formula (E) 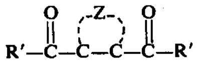

wherein R′ is as previously defined and Z represents the atoms necessary to form an unsaturated, bridged or unbridged carbocyclic nucleus typically having 6 to 7 carbon atoms. Such a carbocyclic nucleus can be substituted or unsubstituted. Particularly suitable acid units are 4-cyclohexene-1,2-dicarboxylic acid, 5-norbornene-2,3-dicarboxylic acid, hexachloro-5[2:2:1]bicycloheptene-2,3-dicarboxylic acid and the like. Such acids are fully disclosed in Canadian Pat. No. 824,096, issued Sept. 30, 1969, the disclosure of which is here incorporated by reference.

The repeating units (I) containing the groups E can also be formed of cyclohexadiene dicarboxylic acid and its derivatives. Such compounds can be generically represented by the formula (F) 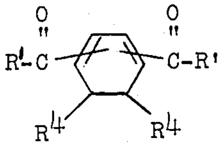

wherein each $R^4$ is a hydrogen atom, an alkyl group of 1 to 12 carbon atoms of branched or straight chain or cyclic configuration (e.g. methyl, ethyl, propyl, isopropyl, butyl, t-butyl, amyl, neopentyl, cyclohexyl, etc.) or an aryl group including mono- or poly-nuclear aryl groups such as phenyl, naphthyl, etc. The alkyl and aryl groups can be substituted with such substituents as do not interfere with the condensation reaction, such as halo, nitro, aryl, alkoxy, aryloxy and the like; $R^1$ is as previously defined and the carbonyl groups are attached to the cyclohexadiene nucleus meta or para to each other and preferably para. Particularly suited cyclohexadiene dicarboxylic acid units include 1,3-cyclohexadiene-1,4-dicarboxylic acid; 1,3-cyclohexadiene-1,3-dicarboxylic acid; 1,3-cyclohexadiene-1,2-dicarboxylic acid; 1,5-cyclohexadiene-1,4-dicarboxylic acid; 1,5-cyclohexadiene-1,3-dicarboxylic acid and alkylated and arylated derivatives of such dicarboxylic acids. Such acids as well as the functional derivatives thereof are fully disclosed in Belgian Pat. No. 754,892, issued Oct. 15, 1970,the disclosure of which is here incorporated by reference.

The second repeating units (II) provided for the purpose of rendering the film-forming copolymer soluble in aqueous alkaline solutions before crosslinking can be formed from aromatic dicarboxylic acids or their derivatives including a disulfonamido group —i.e. a $—SO_2—N—SO_2—$ group— in which the amido nitrogen atom includes as an additional substituent a solubilizing cation. These aromatic dicarboxylic acids are preferably those characterized by the formula (G) 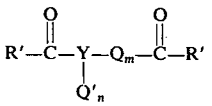

wherein

R′ is as previously defined;

*m* and *n* are integers whose sum equals 1;

Q is defined by the formula (G-1) 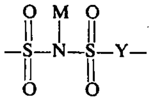

Q′ is defined by the formula (G-2) 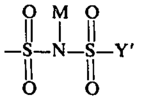

Y is an aromatic group, such as an arylene group (e.g. phenylene, naphthylene, etc.) or an arylidyne group (e.g. phenenyl, $C_6H_3$; naphthylidyne, $C_{10}H_5$; etc.);

Y′ is an alkyl or aromatic group, such as an aryl, alkaryl or aralkyl group, in which each of the alkyl moieties includes from 1 through 12 carbon atoms and, preferably, from 1 through 6 carbon atoms; and M is a solubilizing cation and preferably a monovalent cation such as an alkali metal or ammonium cation.

Compounds preferred for use in forming repeating units (II) are: 3,3′-[(sodio-imino)disulfonyl]dibenzoic acid; 3,3′-[(potassium-imino)disulfonyl]dibenzoic acid; 3,3′-[(lithium-imino)disulfonyl]dibenzoic acid; 4,4′-[(lithiumimino)disulfonyl]dibenzoic acid; 4,4′-[(sodio-imino)disulfonyl]-dibenzoic acid; 4,4′-[(potassium-imino)disulfonyl]dibenzoic acid; 3,4′-[(lithium-imino)disulfonyl]dibenzoic acid; 3,4′-[(sodio-imino)-disulfonyl]dibenzoic acid; 5-[4-chloronaphth-1-ylsulfonyl-(sodio-imino)-sulfonyl]isophthalic acid; 4,4′-[(potassium-imino)-disulfonyl]dinaphthoic acid; 5-[p-tolylsulfonyl-(potassium-imino)-sulfonyl]isophthalic acid; 4-[p-tolyl-sulfonyl-(sodio-imino)-sulfonyl]-1,5-naphthalenedicarboxylic acid; 5-[n-hexylsulfonyl-(lithium imino)-sulfonyl]-isophthalic acid; 2-[phenylsulfonyl-(potassium-imino)-sulfonyl]-terephthalic acid and functional derivatives thereof. These and other dicarboxylic acids useful in forming repeating units (II) of the condensation copolymers of this invention are disclosed in Caldwell and Jones U.S. Pat. No. 3,546,180, issued Dec. 8, 1970, the disclosure of which is here incorporated by reference.

In a preferred form the condensation copolymers of this invention incorporate from 98 to 55 mole percent repeating units (I) and from 2 to 45 mole percent repeating units (II), these mole percentages being based on the total acid units present. In a specific preferred form the repeating units (I) account for from 97 to 85 mole percent while the repeating units (II) account for 3 to 15 mole percent of the copolymer, based on the total acid units present.

In addition to the dicarboxylic acid repeating units (I) and (II) intended to promote crosslinking and solubilization, respectively, the condensation copolymers of this invention can incorporate repeating units (III) to complete the acid units of the condensation polymer. In a preferred form these repeating units can be formed from dicarboxylic acids or their derivatives defined by the formula (H) 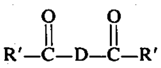

wherein R′ is as previously defined, D is a divalent hydrocarbon radical. D is preferably an arylene or alkylene radical. The repeating units (III) preferably take the form of one or more carboxylic acids or functional derivatives thereof having from 3 to 20 carbon atoms. Preferred aromatic dicarboxylic acids useful in forming the repeating units (III) are phthalic acids, such as phthalic acid, isophthalic acid and terephthalic acid. Exemplary aliphatic dicarboxylic acids include malonic, succinic, glutaric, adipic, pimelic, suberic, azelaic, sebacic and other higher homolog dicarboxylic acids. Since the repeating units (III) serve neither to solubilize nor crosslink the condensation copolymer, they are, of course, optional. If included, they can comprise up to 43 mole percent of the copolymer, based on the total acid units present. Preferably the repeating units (III) comprise no more than 25 mole percent of the copolymer, based on the total acid units present.

The repeating units (I), (II), and (III) can be linked into a condensation copolymer by repeating units (IV) derived from difunctional compounds capable of condensing with a carboxylic acid or a functional derivative thereof. In a preferred form repeating units (IV) can be formed using one or more diols of the formula $$HO—R^5—OH \qquad (J)$$

wherein $R^5$ is a divalent organic radical generally having from about 2 to 12 carbon atoms and including hydrogen and carbon atoms and, optionally, ether oxygen atoms. Exemplary preferred $R^5$ radicals include hydrocarbon radicals, such as straight and branched chain alkylene radicals (e.g. ethylene, trimethylene, neopentylene, etc.), cycloalkylene radicals (e.g. cyclohexylene), cycloalkylenebisalkylene radicals (e.g. 1,4-cyclohexylenedimethylene), and arylene radicals (e.g. phenylene) and hydrocarbon-oxy-hydrocarbon radicals, such as alkylene-oxy-alkylene, alkylene-oxy-cycloalkylene-oxyalkylene, and the like. Exemplary diols that can be utilized in preparing the condensation copolymers of this invention include ethylene glycol, diethylene glycol, 1,3-propanediol; 1,4-butanediol; 1,5-pentanediol; 1,6-hexanediol; 1,7-heptanediol; 1,8-octanediol; 1,9-nonanediol; 1,10-decanediol; 1,12-dodecanediol; neopentyl glycol; 1,4-cyclohexane dimethanol; 1,4-bis(β-hydroxy ethoxy)-cyclohexane and the like. The corresponding diamines can, if desired, be substituted for the diols in forming condensation copolymers according to this invention. One or a mixture of diols and/or diamines can be used in forming the condensation copolymers.

As is well known, the formation of the copolymer by condensation inherently determines that the repeating units (IV) will approximately equal on a molar basis the sum of the number of repeating units (I), (II) AND (III) present. As a practical matter, it is frequently desirable to utilize an excess of up to about 10 molar percent of the reactant forming the repeating units (IV). The preparation of the condensation copolymers can be accomplished using procedures generally known to those skilled in the art, such as, for example, those preparation procedures described in the patents cited and incorporated by reference above. Typically the condensation copolymers are formed by mixing the reactants in the presence of a catalyst, such as butyl titanate, titanium isopropoxide, antimony oxide, strontium oxide, zinc acetate, and the like. The degree and duration of heating can be used to increase the degree of polymerization achieved. Typically it is desirable that the condensation copolymers of this invention exhibit an inherent viscosity of from 0.2 to 1.0 and, most preferably, from 0.3 to 0.8. Unless otherwise stated all inherent viscosities are to be understood as being measured in 1:1 phenol:chlorobenzene (volume ratio) at 25°C. using 0.25 grams of polymer per deciliter of solution.

Coating compositions containing the crosslinkable copolymers of this invention can be prepared by dispersing or dissolving the copolymer in any suitable solvent or combination of solvents used in the art to prepare polymer dopes. The solvents are chosen to be substantially unreactive toward the crosslinkable copolymers within the time period contemplated for maintaining the solvent and polymer in association and are chosen to be compatible with the substrate employed for coating. While the best choice of solvent will vary with the exact polymer and application under consideration, exemplary preferred solvents include benzyl alcohol, cyclohexanone, dioxane, 2-methoxyethyl acetate, N,N'-dimethylformamide, chloroform, trichloroethylene, 1,2-dichloroethane, 1,1-dichloroethane, 1,1,2-trichloroethane, tetrachloroethane, chlorobenzene and mixtures thereof. It is appreciated that crosslinkable copolymers of the present invention are also soluble in aqueous alkaline solutions and, more specifically, the developers hereinafter more fully described. While these can be used as solvents for the coating compositions, their use is not preferred where a relatively rapid and complete separation of the solvent from the crosslinkable copolymer is contemplated, as in typical coating applications in which the solvent is intended to be volatilized.

Optimum concentrations of the crosslinkable polymers in the coating solutions are dependent upon the specific polymer as well as the support and the coating method employed. Particularly useful coatings are obtained when the coating solutions contain about 1 to 50 percent by weight, and, preferably, about 2 to 10 percent by weight, crosslinkable polymer. Higher concentrations, of course, give satisfactory results.

Radiation-sensitivity can be stimulated in the coating composition by incorporating a sensitizer. Suitable sensitizers include anthrones, such as 1-carbethoxy-2-keto-3-methyl-2-azabenzanthrone, benzanthrone and those anthrones disclosed in U.S. Pat. No. 2,670,285; nitro sensitizers such as those disclosed in U.S. Pat. No. 2,610,120; triphenylmethanes such as those disclosed in U.S. Pat. No. 2,690,966; quinones such as those disclosed in U.S. Pat. No. 2,670,286; cyanine dye sensitizers; naphthone sensitizers such as 6-methoxybeta-2-furyl-2-acrylonaphthone; pyrylium or thiapyrylium salts, such as 2,6-bis(p-ethoxyphenyl)-4-(p-n-amyloxyphenyl)-thiapyrylium perchlorate and 1,3,5-triphenylpyrylium fluoroborate; furanone; anthraquinones such as 2-chloroanthraquinone; thiazoles such as 2-benzoylcarbethoxymethylene-1-methyl-betanaphthothiazole and methyl 2-(N-methylbenzothiazolylidene) dithioacetate; methyl 3-methyl-2-benzothiazolidene dithioacetate; thiazolines such as 3-ethyl-2-benzoylmethylenenaphtho[1,2-d]-thiazoline, benzothiazoline, (2-benzoylmethylene)-1-methyl-beta-naphthothiazoline; 1,2-dihydro-1-ethyl-2-phenacylidenenaphtho[1,2-d]-thiazole; and naphthothiazoline; quinolizones, Michler's ketone; and Michler's thioketone as well as other sensitizers, such as those disclosed in French Pat. Nos. 1,238,262; 1,089,290 and 1,086,257 and U.S. Pat. Nos. 2,732,301; 2,670,285 and 2,732,301.

The crosslinkable copolymers of this invention such as those incorporating one or more of the repeating units (I) formed from compounds A through D are directly responsive to actinic radiation. The sensitizers noted above are merely used to enhance this responsiveness. The crosslinkable copolymers of this invention need not, however, be directly crosslinked in response to exposure to actinic radiation. The crosslinkable copolymers can be crosslinked by employing radiation-responsive sensitizers that act as crosslinking agents, such as ketone-type and azide-type sensitizers. Typical aryl ketone sensitizers include such compounds as benz(a)-anthracene-7,12-dione and 4,4'-bis(dimethylamino)-benzophenone. Other advantageous ketone-type sensitizers are, for example, 4,4'-tetraethyldiaminodiphenyl ketone, dibenzalacetone and 4,4'-bis(dimethylamino)benzophenone imide, as well as additional sensitizers of the type described in U.S. Pat. No. 2,670,287.

Azide-type sensitizers useful herein include a wide variety of aryl azides, such as those of British Pat. Nos. 767,985; 886,100 and 892,811, which are desirable sensitizers for negative-working elements. Additionally, the sensitizers of U.S. Pat. No. 2,940,853 can also be suitably employed in a like manner. Particularly useful aryl azide sensitizers are bisaryl azides such as 2,6-bis(p-azidobenzylidene)-4-methylcyclohexanone. Other advantageously employed azide sensitizers which promote crosslinking are well known in the art.

The sensitizer can be present in the coating composition in any desired concentration effective to stimulate crosslinking in response to radiation or can be omitted entirely where the crosslinkable polymer is itself radiation-sensitive. It is generally preferred to incorporate the sensitizer in a concentration of from 0.01 to 20 percent by weight based on the weight of the crosslinkable copolymer. Still higher concentrations of sensitizer can be incorporated without adverse effect.

In addition to the sensitizers a number of other addenda can be present in the coating composition and ultimately form a part of the completed radiation-responsive element. It is frequently desirable to incorporate pigments and dyes into the coating composition for the purpose of producing a coating of a desired color or degree of contrast to a given support or background. Exemplary preferred dyes useful for this purpose are those set forth in Table I.

TABLE I

| Class | EXEMPLARY PREFERRED DYES<br>Dye Name | CI No. |
|---|---|---|
| Monoazo | 1. Fast Acid Red BL | 17045 |
| | 2. Eastone Red R | — |
| Diazo | 1. Oil Red O | 26125 |
| | 2. Sudan III | 26100 |
| | 3. Sudan IV | 26105 |
| Methine | 1. Genacryl Red 6B | 48020 |
| | 2. Genacryl Orange R | 48040 |
| | 3. Celliton Yellow 5G | — |
| Anthraquinone | 1. Alizarin Light Red Base | 68215 |
| | 2. Sevron Blue 2G | — |
| | 3. Anthraquinone Violet 3RN | — |
| Triarylmethane | 1. Astrazon Blue B | 42140 |
| | 2. Victoria Blue B Base | — |
| | 3. Brilliant Green Crystals | 42040 |
| Thiazine | 1. Methylene Blue A Ex Conc. | — |
| Xanthene | 1. Rhodamine 6G | — |
| | 2. Rhodamine 3B Extra | 45175 |
| | 3. Xylene Red | 45100 |
| Phthalocyanine | 1. Azosol Fast Blue HLR | — |
| Azine | 1. Safranin-O | 50240 |

By choosing the dye or pigment to contrast with the background provided by its supporting surface, the coating layer produces a readily visible image upon exposure and development. In many instances, however, it is desirable to have a visible indication of exposure before development. This can be a convenience in many instances, such as in step and repeat exposure operations, where the coated elements are stored for some time between exposure and development or where it is desirable to evaluate the image achieved by exposure before development. To provide this capability it is frequently desirable to include in the coating composition an indicator dye that is capable of either printout or bleachout on exposure of the radiation-sensitive coating produced therefrom. A wide variety of useful exposure indicator dyes are known to the art which can be employed. Preferred exposure indicator dyes include photochromic dyes such as spirobenzopyrans (e.g. 3′,3′-dimethyl-6-nitro-1′-phenylspiro[2H-1]benzopyran-2,2′-indoline, 5′-methoxycarbonyl-8-methoxy-1′,3′,3′-trimethyl-6-nitrospiro[2H-1]benzopyran-2,2′-indoline, and the like); leuco dye and activator combinations—e.g. dyes like tris-(N,N-dipropylaminophenyl)methane, tris(N,N-diethylaminophenyl)-methane, tris(N,N-dimethylaminophenyl)methane and the like in combination with activators such as N-methoxide activators (e.g. N-methoxy-4-methylpyridinum-p-toluenesulfonate) and halogenated compounds (e.g. carbon tetrabromide); pH sensitive dyes such as bis[4,4′-bis(dimethylamino)-benzhydrol] ether useful in combination with the leuco dye activators noted above; and cyanine dyes such as disclosed in Mitchell U.S. Pat. No. 3,619,194.

It is recognized that the copolymers of this invention can become crosslinked prior to intended exposure if the compositions or elements of this invention are stored at elevated temperatures, in areas permitting exposure to some quantity of actinic radiation and/or for extended periods of time. To insure against crosslinking the copolymers inadvertently before intended exposure to actinic radiation stabilizers can be incorporated into the radiation-sensitive compositions and coated layers of this invention. Useful stabilizers include phenols, such as 2,6-di-tert.-butyl-p-cresol, 2,6-di-tert.-butylanisole and p-methoxyphenol; hydroquinones, such as hydroquinone, phloroglucinol and 2,5-di-tert.-butylhydroquinone; triphenylmetallics, such as tripenylarsine; triphenylstilbene; and tertiary amines, such as N-methyldiphenylamine.

As is well understood in the art, the above addenda which together with the radiation-sensitive copolymers make up the radiation-sensitive layer finally produced are present in only a minor concentration. Individual addenda are typically limited to concentrations of less than about 5 percent by weight of the radiation-sensitive layer.

Particularly advantageous coating compositions contain at least one other film-forming polymeric resin in addition to the crosslinkable polymers of this invention. These additional polymeric resins are typically not radiation-sensitive, although mixtures of radiation-sensitive resins can be employed and are usually selected from those resins which are soluble in the coating solvent. The amount of resin employed can be varied, depending upon the resin, the crosslinkable polymer, the coating solvent, and the coating method and application chosen. Useful results can be obtained using coating compositions containing up to 5 parts of resin per part of crosslinkable polymer on a weight basis. Generally preferred coating compositions are those that contain from 0.05 to 1.0 part resin per part of crosslinkable polymer on a weight basis.

Exemplary of preferred film-forming resins useful in the coating compositions of this invention are phenolic resins, such as novolac and resole resins. These resins are particularly useful in improving the resistance of coatings to etchants when the coating composition is used as a photo-resist composition. Where it is desired to control wear resistance of the coatings produced from the coating composition, as in lithographic and relief plates, it can be desirable to incorporate resins, such as epoxy resins; hydrogenated rosin; poly(vinyl acetals); and acrylic polymers and copolymers, such as poly(methyl methacrylate), acrylates of the type disclosed in British Pat. No. 1,108,383, poly-(alkylene oxides) and poly(vinyl alcohol). The crosslinkable polymers of this invention are also generally compatible with linear polyesters.

Elements bearing radiation-sensitive layers can be prepared by forming coatings with the coating composition and removing the solvent by drying at ambient or elevated temperatures. Any one of a variety of conventional coating techniques can be employed, such as spray coating, dip coating, whirl coating, roller coating, etc.

Suitable support materials can be chosen from among a variety of materials which do not directly chemically react with the coating composition. Such support materials include fiber base materials such as paper, polyethylene-coated paper, polypropylene-coated paper, parchment, cloth, etc.; sheets and foils of such metals as aluminum, copper, magnesium, zinc, etc.; glass and glass coated with such metals as chromium, chromium alloys, steel, silver, gold, platinum, etc.; synthetic resin and polymeric materials such as poly(alkyl acrylates), e.g. poly(methyl methacrylate), polyester film base—e.g. poly(ethylene terephthalate), poly(vinyl acetals), polyamides—e.g. nylon and cellulose ester film base—e.g. cellulose nitrate, cellulose acetate, cellulose acetate propionate, cellulose acetate butyrate and the like.

Specific support materials which are useful in forming printing plates—particularly lithographic printing plates—include supports such as zinc, anodized aluminum, grained aluminum, copper and specially prepared metal and paper supports, superficially hydrolyzed cellulose ester films; and polymeric supports such as polyolefins, polyesters, polyamide, etc.

The supports can be preliminarily coated—i.e. before receipt of the radiation-sensitive coating—with known subbing layers such as copolymers of vinylidene chloride and acrylic monomers—e.g. acrylonitrile, methyl acrylate, etc. and unsaturated dicarboxylic acids such as itaconic acid, etc.; carboxymethyl cellulose; gelatin; polyacrylamide; and similar polymer materials.

The support can also carry a filter or anti-halation layer composed of a dyed polymer layer which absorbs the exposing radiation after it passes through the radiation-sensitive layer and eliminates unwanted reflection from the support. A yellow dye in a polymeric binder, such as one of the polymers referred to above as suitable subbing layers, is an especially effective antihalation layer when ultraviolet radiation is employed as the exposing radiation.

The optimum coating thickness of the radiation-sensitive layer will depend upon such factors as the use to which the coating will be put, the particular radiation-sensitive polymer employed, and the nature of other components which may be present in the coating. Typical coating thicknesses can be from about 0.05 to 10.0 microns or greater, with thicknesses of from 0.1 to 2.5 microns being preferred for lithographic printing plate applications.

The photographic elements of this invention can be exposed by conventional methods, for example, through a transparency or a stencil, to an imagewise pattern of actinic radiation which is preferably rich in ultraviolet light. Suitable sources include carbon arc lamps, mercury vapor lamps, fluorescent lamps, tungsten filament lamps, lasers and the like. The elements of this invention can be handled and viewed in light above about 500 nm in wavelength, as is conventional practice.

The exposed radiation-sensitive elements of this invention can be developed by flushing, soaking, swabbing or otherwise treating the radiation-sensitive layer with a solution (hereinafter referred to as a developer) which selectively solubilizes (i.e. transports) the unexposed areas of the radiation-sensitive layers. The developer is typically an aqueous alkaline solution having a pH in the range of from about 9 to 14. Basicity can be imparted to the developer by the incorporation of soluble inorganic basic compounds such as alkali metal hydroxides, phosphates, sulfates, silicates, carbonates and the like as well as combinations thereof. Alternatively or in combination, basic, soluble organic substances such as amines—e.g. triethanol amine, diethylene amine, diethylaminoethanol, etc.—can be incorporated.

In a preferred form the developer includes a miscible combination of water and alcohol as a solvent system. The proportions of water and alcohol can be varied widely but are typically within the range of from 20 to 80 percent by volume water and from 80 to 20 percent by volume alcohol, based on the total developer volume. Most preferably the water content is maintained within the range of from 40 to 60 percent by volume, based on total volume, with the remainder of the solvent system consisting essentially of alcohol. Any alcohol or combination of alcohols that does not chemically adversely attack the radiation-sensitive coating during development and that is miscible with water in the proportions chosen for use can be employed. Exemplary of useful alcohols are glycerol, benzyl alcohol, 2-phenoxyethanol, 1,2-propanediol, sec-butyl alcohol and ethers derived from alkylene glycols—i.e. dihydroxy poly(alkylene oxides)—e.g. dihydroxy poly(ethylene oxide), dihydroxy poly(propylene oxide), etc.

It is recognized that the developer can, optionally, contain additional addenda. For example, the developer can contain dyes and/or pigments. Where the developer is being used to develop the image of a lithographic plate, it can be advantageous to incorporate into the developer anti-scumming and/or anti-blinding agents, as is well recognized in the art.

The element can then be treated in any known manner consistent with its intended use. For example, printing plates are typically subjected to desensitizing etches. Where the developed radiation-sensitive coating layer forms a resist layer, the element is typically subjected to acidic or basic etchants and to plating baths.

The invention is illustrated by the following examples.

EXAMPLES 1 THROUGH 45

Part A The Preparation of Polyesters from Diethyl p-Phenylenediacrylate (DEBA), Dimethyl 3,3'-[Sodioimino)disulfonyl]dibenzoate (SISB) and 1,4-Bis($\beta$-hydroxyethoxy)cyclohexane (HEC)

Two and two-tenths grams (0.005 mole) of dimethyl 3,3'-[(sodio-imino)disulfonyl]dibenzoate, 26.03 g (0.095 mole) diethyl p-phenylenediacrylate and 35 g (0.17 mole) 1,4-($\beta$-hydroxyethoxy)cyclohexane were weighed in that order into a 200 ml polymerization flask. The side arm of the flask was fitted with a cork and the flask itself fitted with a glass tube reaching the material in the flask such that nitrogen gas could be bubbled through the reaction mixture during the first stage of heating. The flask was also fitted with Vigreux column for reflux return of high boiling material during this first heating stage, but such that the generated alcohols were distilled. The contents were melted by inserting the flask in a silicone oil bath held at 235°C. Two drops (1/20 ml) of titanium isopropoxide was added to the melt and the flask and contents were heated under reflux for 4 hours. The Vigreux column, inert gas tube and the cork were removed and the side arm connected to a vacuum system in series with two dry ice-acetone traps. A stainless steel crescent shaped stirrer, fitted with a vacuum tight ball joint, was inserted into the reaction melt to stir the polymer.

The pressure was gradually lowered to 0.05 mm Hg with stirring, at which pressure the polyester was stirred for 40 minutes, collecting distillate in the two dry-ice traps. The final inherent viscosity was determined by monitoring the final stage of the reaction with a Cole-Parmer Model 4425 Constant Speed and Torque Control Unit operating at 200 rpm and terminating the reaction when the desired inherent viscosity had been reached. A glassy amber polymer was obtained. The isolated polymer had an inherent viscosity of 0.48. The components and inherent viscosities of additional polyesters prepared as described in Example 1 are recorded in Table I. In each instance the glycol component of the polyesters consisted essentially of 1,4-(β-hydroxyethoxy)cyclohexane (HEC).

TABLE I

Inherent Viscosities and Mole Percentages of Acid Components in the Polyesters

| Acid Components (SISB) | Mole Percent (DEBA) | Inherent Viscosity | Example No. |
|---|---|---|---|
| 3 | 97 | 0.48 | 1 |
| 3 | 97 | 0.59 | 2 |
| 3 | 97 | 0.73 | 3 |
| 3 | 97 | 0.50 | 4 |
| 3 | 97 | 0.70 | 5 |
| 3 | 97 | 0.52 | 6 |
| 3 | 97 | 0.38 | 7 |
| 3 | 97 | 0.67 | 8 |
| 3 | 97 | 0.59 | 9 |
| 5 | 95 | 0.9 | 10 |
| 5 | 95 | 0.53 | 11 |
| 5 | 95 | 0.35 | 12 |
| 5 | 95 | 0.48 | 13 |
| 5 | 95 | 0.41 | 14 |
| 5 | 95 | 0.61 | 15 |
| 5 | 95 | 0.75 | 16 |
| 5 | 95 | 0.29 | 17 |
| 5 | 95 | 0.32 | 18 |
| 5 | 95 | 0.42 | 19 |
| 5 | 95 | 0.58 | 20 |
| 3 | 97 | 0.33 | 21 |
| 3 | 97 | 0.37 | 22 |
| 3 | 97 | 0.45 | 23 |
| 3 | 97 | 0.48 | 24 |
| 3 | 97 | 0.56 | 25 |
| 3 | 97 | 0.69 | 26 |
| 5 | 95 | 0.35 | 27 |
| 5 | 95 | 0.40 | 28 |
| 5 | 95 | 0.42 | 29 |
| 5 | 95 | 0.48 | 30 |
| 5 | 95 | 0.50 | 31 |
| 5 | 95 | 0.54 | 32 |
| 7 | 93 | 0.35 | 33 |
| 7 | 93 | 0.41 | 34 |
| 7 | 93 | 0.49 | 35 |
| 7 | 93 | 0.52 | 36 |
| 7 | 93 | 0.57 | 37 |
| 9 | 91 | 0.32 | 38 |
| 9 | 91 | 0.38 | 39 |
| 9 | 91 | 0.43 | 40 |
| 9 | 91 | 0.49 | 41 |
| 9 | 91 | 0.55 | 42 |
| 12 | 88 | 0.33 | 43 |
| 12 | 88 | 0.40 | 44 |
| 12 | 88 | 0.52 | 45 |

Part B Evaluation of the Polyesters Prepared in Part A

Formulations were prepared from the polymers tabulated in Table I. The general composition was as follows:

| | |
|---|---|
| 2.5 grams | Polyester prepared in Part A |
| 0.10 gram | (2-benzoylmethylene)-1-ethyl-β-naphthothiazoline |
| 0.10 gram | 2,6-di-tert.-butyl-p-cresol |
| 100 cc | dichloroethane |

Each formulation was filtered through a coarse filter paper. The solution was whirl-coated at 100 rpm on phosphoric anodized aluminum support (see U.S. Pat. No. 3,511,661, issued May 12, 1970) for 2 minutes plus additional drying for 15 minutes at 50°C. The dried coating was exposed imagewise to a line negative on a Xenon source exposure device commercially available under the trademark NuArc Flip Top Platemaker. The exposed plate was swab-developed by applying the developer having the composition shown below, to the plate surface and allowing it to soak 15 seconds followed by swabbing for 30 seconds. Desensitizer gum was then applied, followed by hand inking.

The aqueous alcohol alkaline developer mentioned above readily developed the coatings. The composition of this developer is as follows:

Developer

| | |
|---|---|
| 33 cc | Glycerol |
| 4 cc | 2-Phenoxyethanol |
| 10 cc | 2-Ethoxyethanol |
| 50 cc | Distilled water |
| 3 cc | 2-Diethylaminoethanol |

Results are listed below in Table II. Photographic speed was assessed by exposure through a step tablet having 14 steps with a step density increment of 0.3. The number of steps crosslinked to give a full ink image is set out under the heading Solid Steps. The number of additional steps yielding some degree of visible ink image in printing is set out under the heading Toe Steps.

TABLE II

Exemplary Lithographic Plate Performance

| Example | Inherent Viscosity | Non-Image Areas | Ink Receptivity | Photospeed Solid Steps | Photospeed Toe Steps |
|---|---|---|---|---|---|
| 2 | 0.59 | Clean | OK | 10 | 2 |
| 3 | 0.73 | Clean | OK | 9 | 2 |
| 4 | 0.50 | Clean | OK | 10 | 2 |
| 5 | 0.70 | Clean | OK | 9 | 2 |
| 6 | 0.52 | Clean | OK | 11 | 2 |
| 7 | 0.38 | Clean | OK | 10 | 1 |
| 8 | 0.67 | Clean | OK | 9 | 1 |
| 9 | 0.59 | Clean | OK | 10 | 2 |
| 10 | 0.90 | Clean | OK | 9 | 1 |
| 11 | 0.53 | Clean | OK | 8 | 1 |
| 13 | 0.48 | Clean | OK | 10 | 1 |
| 14 | 0.41 | Clean | OK | 9 | 1 |
| 15 | 0.61 | Clean | OK | 10 | 1 |
| 16 | 0.76 | Clean | OK | 11 | 1 |
| 18 | 0.32 | Clean | OK | 7 | 1 |
| 19 | 0.42 | Clean | OK | 9 | 1 |
| 20 | 0.58 | Clean | OK | 10 | 1 |

TABLE II-continued

| | Exemplary Lithographic Plate Performance | | | | |
|---|---|---|---|---|---|
| Example | Inherent Viscosity | Non-Image Areas | Ink Receptivity | Photospeed Solid Steps | Toe Steps |
| 21 | 0.33 | Clean | OK | 7 | 2 |
| 22 | 0.37 | Clean | OK | 7 | 2 |
| 23 | 0.45 | Clean | OK | 8 | 2 |
| 24 | 0.48 | Clean | OK | 9 | 2 |
| 25 | 0.56 | Clean | OK | 9 | 2 |
| 26 | 0.69 | Clean | OK | 9 | 2 |
| 27 | 0.35 | Clean | OK | 9 | 2 |
| 28 | 0.40 | Clean | OK | 9 | 2 |
| 29 | 0.42 | Clean | OK | 9 | 2 |
| 30 | 0.48 | Clean | OK | 10 | 2 |
| 31 | 0.50 | Clean | OK | 10 | 3 |
| 32 | 0.54 | Clean | OK | 11 | 2 |
| 33 | 0.35 | Clean | OK | 7 | 2 |
| 34 | 0.41 | Clean | OK | 7 | 1 |
| 35 | 0.49 | Clean | OK | 7 | 2 |
| 36 | 0.52 | Clean | OK | 8 | 2 |
| 37 | 0.57 | Clean | OK | 7 | 2 |
| 38 | 0.32 | Clean | OK | 8 | 2 |
| 39 | 0.38 | Clean | OK | 9 | 2 |
| 40 | 0.43 | Clean | OK | 9 | 2 |
| 41 | 0.49 | Clean | OK | 9 | 2 |
| 42 | 0.55 | Clean | OK | 10 | 2 |
| 43 | 0.33 | Clean | OK | 9 | 2 |
| 44 | 0.40 | Clean | OK | 9 | 2 |
| 45 | 0.52 | Clean | OK | 10 | 2 |

TABLE IV

| | Exemplary Lithographic Plate Performance | | | | |
|---|---|---|---|---|---|
| Example | Inherent Viscosity | Non-Image Areas | Ink Receptivity | Photospeed Solid Steps | Toe Steps |
| 47 | 0.59 | Clean | OK | 4 | 3 |
| 48 | 0.33 | Clean | OK | 4 | 3 |
| 50 | 0.47 | Clean | OK | 6 | 4 |

EXAMPLE 46

Lithographic printing plates prepared as described in Examples 1 through 45 exhibit no image loss after 10,000 press run impressions on 1250 Multilith duplicator press employing either conventional or Dahlgren (alcoholic solution of gum arabic) fountain solution.

EXAMPLES 47 THROUGH 50

Preparation of Polyesters from Diethyl p-Phenylenediacrylate (DEBA), Dimethyl 5-[(N-Potassio-p-toluenesulfonamido)-sulfonyl]isophthalate (PTSS), and 1,4-Bis($\beta$-hydroxyethoxy)cyclohexane (HEC)

These polymers were prepared by the procedure of Example 1, except using 25.5 g (0.093 mole) of diethyl p-phenylenediacrylate (DEBA), 3.26 g (0.007 mole) of dimethyl 5-[(N-potassio-p-toluenesulfonamido)sulfonyl]isophthalate (PTSS), 35.1 g (0.72 mole) of 1,4-bis($\beta$-hydroxyethoxy)-cyclohexane (HEC), and 3 drops of tetra-isopropyl orthotitanate.

The inherent viscosities of the polyesters prepared is reported in Table III. Lithographic plates were prepared from these polyesters as described for Examples 1 through 45. Their properties are set forth in Table IV.

TABLE III

| Acid Components (PTSS) | Mole Percent (DEBA) | Inherent Viscosity | Example No. |
|---|---|---|---|
| 7 | 93 | 0.59 | 47 |
| 7 | 93 | 0.33 | 48 |
| 7 | 93 | 0.27 | 49 |
| 7 | 93 | 0.47 | 50 |

The invention has been described in detail with particular reference to preferred embodiments thereof but it will be understood that variations and modifications can be effected within the spirit and scope of the invention.

We claim:

1. In a lithographic printing plate comprised of a hydrophilic support means having as a radiation sensitive coated layer thereon a composition comprised of a condensation copolymer said copolymer having first dicarboxylic acid derived repeating units containing non-aromatic vinyl unsaturation capable of providing crosslinking sites for the purpose of insolubilizing said copolymer upon exposure of said composition to actinic radiation, the improvement comprising:
   the inclusion within said copolymer of second, aromatic dicarboxylic acid derived repeating units each containing a disulfonamido unit containing a monovalent cation as an amido nitrogen atom substituent thus rendering said copolymer in its unexposed form soluble in an aqueous alkaline developer.

2. A lithographic printing plate according to claim 1 in which said support means includes an aluminum support.

3. In a lithographic printing plate comprised of hydrophilic support means having as a radiation-sensitive coated layer thereon a composition comprised of a sensitizer and a condensation copolymer soluble in an aqueous alkaline developer, said copolymer having first dicarboxylic acid derived repeating units containing non-aromatic vinyl unsaturation capable of providing crosslinking sites for the purpose of insolubilizing said copolymer to form hydrophobic printing areas upon exposure of said composition to actinic radiation, the improvement comprising:

the inclusion within said copolymer of second dicarboxylic acid derived repeating units characterized by the formula

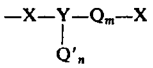

wherein

X is a carbonyl group;

*n* and *m* are integers whose sum equals 1;

Q is defined by the formula

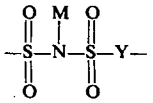

Q' is defined by the formula

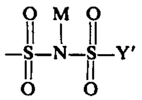

Y is an aromatic group;

Y' is an aromatic group or an alkyl group including from 1 through 12 carbon atoms; and M is a solubilizing cation.

4. In a lithographic printing plate according to claim 3 the further improvement in which said first dicarboxylic acid derived repeating units contain at least two condensation sites, at least one of which includes a group of the formula

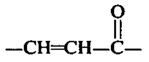

bonded directly to an aromatic nucleus by the vinyl group.

5. In a lithographic printing plate according to claim 4 the further improvement in which said first dicarboxylic acid derived repeating units include a group of the formula

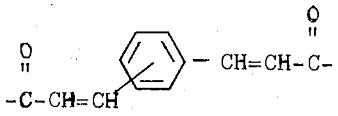

6. In a lithographic printing plate according to claim 5 the further improvement in which the vinyl carbonyl units are located para to each other.

* * * * *